United States Patent [15] 3,660,154
Scott-Monck et al. [45] May 2, 1972

[54] METHOD FOR PRODUCING IMPROVED SEMICONDUCTIVE DIODES

[72] Inventors: John A. Scott-Monck, Redondo Beach, Calif.; Arthur J. Learn, West Concord, Mass.

[73] Assignee: TRW Inc., Redondo Beach, Calif.

[22] Filed: Aug. 15, 1968

[21] Appl. No.: 752,756

[52] U.S. Cl. ........................117/200, 117/106 A, 148/6.24, 117/118

[51] Int. Cl. ........................................B44d 1/18, H01l 7/00

[58] Field of Search...............117/200, 106 A, 118; 148/6.24

[56] References Cited

UNITED STATES PATENTS 3,398,021 8/1968 Lehrer et al. ..........................117/200

*Primary Examiner*—William L. Jarvis
*Attorney*—Daniel T. Anderson, Alan D. Akers and James V. Tura

[57] ABSTRACT

This invention relates to a method for producing improved polycrystalline semiconductive thin film diodes having an increased interfacial barrier height and an increased rectification ratio. The improved diodes are obtained by treating the surface of the polycrystalline semiconductive sulfur compound with an excess of elemental sulfur.

11 Claims, No Drawings

METHOD FOR PRODUCING IMPROVED SEMICONDUCTIVE DIODES

In a solid state diode consisting of a semiconductor, a non-ohmic or blocking contact, and an ohmic contact, an energy or electrical potential barrier exists at the interface between the semiconductor and the blocking contact. In order for a substantial density of current carriers to surmount this energy barrier, an amount of energy must be provided to the carriers, as for example by the direct application of an electrical potential. This amount of energy is generally called the barrier height and most frequently is specified in electron-volts.

It is well known that current rectification can occur in a solid state diode of the type described above. The rectification ratio, or the ratio of forward to reverse current for equal voltages of opposite sign, must be large to render the device useful for rectification purposes. Generally the forward current, or the current in the easy direction of current flow, is primarily determined by the bulk resistance of the semiconductor. The reverse current is primarily determined by the barrier height. In general, the larger the barrier height, the smaller will be the reverse current, and therefore the larger will be the rectification ratio.

Heretofore, the thin film semiconductive diodes, wherein the semiconductive film is polycrystalline in nature have exhibited rectifying, properties that are inferior to those of semiconductive diodes in which the semiconductor is made of single crystal material. The inferior behavior of the thin film diode is generally attributed to the poor quality of the barrier which is theorized to result from an excess of the cationic component on the surface of the semiconductive film.

In general, the process according to this invention involves treating the surface of a polycrystalline semiconductive compound with an excess of the anionic component so as to reduce or eliminate the excess cationic component in the barrier layer.

In the preferred method of this invention, a smooth inert, nonconducting substrate, such as for example, clean, polished plastics, ceramics, or dielectrics having a mask positioned on the surface of the substrate whose opening corresponds to the desired shape of the electrode, is placed in a vacuum deposition apparatus. A vacuum of $10^{-6}$ torr or less is applied while a first electrode of a low work function metal is deposited at room temperature on the substrate to a thickness of approximately 200 angstroms or greater. Low work function metals suitable for this electrode are aluminum, or chromium.

After deposition of the first electrode, the mask is removed and a second mask having a different configuration opening is superimposed thereon. The substrate and electrode are exposed to a semiconductive compound vapor source while the substrate is maintained at approximately 175° C. It is desirable to heat the substrate while depositing the semiconductive layer in order to achieve high resistivity in the latter and thus obtain a depletion region of substantial width. Semiconductive compounds such as cadmium sulfide, zinc sulfide, cadmium telluride, and zinc telluride may be vapor deposited on a heated substrate to a thickness of about 2 to 3 microns.

The structure is then removed from the vacuum deposition apparatus. The semiconductor-substrate is then exposed to a source of the elemental anionic component of the semiconductive compound. The elemental anionic component such as sulfur, may be in a gaseous state or carried in a liquid medium.

When a liquid medium is used, sulfur is added to a hot inert oil such as Dow Corning DC 704 silicone oil, in sufficient amount that sulfur crystals are visible upon cooling of the bath below the solidification temperature for sulfur. A preferred temperature for the silicon oil-sulfur treatment is about 300° C., although any temperature within the range of 250° to 400° C. has been found to be satisfactory. Temperatures below 250° C. show no significant improvement in barrier height, while at temperatures above 400° C. the semiconductive compound experiences deleterious changes. After the sulfur treatment, the layered structure is removed from the hot oil, allowed to cool, and then washed with a solvent such as oxylene or acetone to remove excess oil.

The treated structure is returned then to the vacuum deposition apparatus, and the blocking contact layer such as gold, platinum, copper is deposited on the semiconductive layer. While the blocking contact layer is being deposited, the substrate is maintained at room temperature.

When the semiconductive surface is treated in a vapor medium, the sulfur treatment process is simplified in that removal from the vapor deposition apparatus is unnecessary. After deposition of the semiconductive material is completed, a sulfur source already in the apparatus is used for the subsequent sulfur vapor deposition.

Although treatment of the semiconductor material prior to deposition of the counter electrode is the preferred fabrication method, it should be understood that the sulfur treatment after deposition of the counter electrode can be effected for the case of sulfur in a liquid medium. If the semiconductor surface is treated after the deposition of the counter electrode, temperatures and treatment times must be adjusted to permit diffusion of the sulfur through the counter electrode metal. As an example, for a gold thickness of 125A., 2 to 3 minutes at 300° C. is sufficient to optimize the barrier height. For a thickness of 1000A. of gold a time of 1 hour is necessary to optimize the barrier height at 300° C. By either process, treatment times and temperatures should not be excessive inasmuch as an aging effect is produced which reduces the barrier height and thereby permits increased reverse current density.

So that the process of this invention may be better understood, the following example is presented. It is to be understood that this example is for the purpose of illustration and is representative of but a few of the many embodiments and combinations within the scope of this invention.

EXAMPLE

A polished Pyrex substrate was masked and positioned in a standard vacuum deposition apparatus over a boat containing powdered chromium. The apparatus was sealed and a vacuum of $10^{-6}$ torr was applied. A layer of three strips of chromium about 500 angstroms in thickness was first deposited onto the polished Pyrex substrate. A second mask was superimposed over the substrate and a honeycombed molybdenum block containing Eagle-Picher ultra-high purity grade cadmium sulfide powder was placed beneath the substrate, and heated to about 750° C for 60 minutes. An n-type cadmium sulfide film was produced which had dark resistivity of $10^4$ ohm-cm. The film exhibited preferred orientation with the basal plane nearly parallel to the substrate surface. The film was removed from the system and placed in a stainless steel beaker embedded in heater coils and filled with 500 millimeters of silicone oil containing 10 grams of sulfur. Temperature of the bath was controlled with a Temp-Tendor controller at a temperature of 280° ± 2° C. The specimen was treated in the bath for 5 minutes and upon removal from the bath excess oil was rinsed from the surface using Dupont Freon TF solvent. The film was then returned to the vacuum deposition apparatus together with a gold source. Upon applying a vacuum of $10^{-6}$ torr, a gold film was deposited from a beryllium oxide source at the rate of the order of 1 angstrom per second through a third mask. The cumulative thickness of gold deposited was 125 angstroms. The gold was deposited as a single strip which crossed over three chromium strips covered by the cadmium sulfide. Thus three diodes per substrate were obtained, each with an area of 0.07 $cm^2$.

A number of alternative arrangements will readily suggest themselves to those skilled in the art. However, although the invention has been described with a degree of particularity, it is to be understood that the present disclosure has been made only by way of example and that numerous changes and details of construction and arrangements of parts may be resorted to without departing from the spirit and the scope of the invention as hereinafter claimed.

We claim:

1. A method of fabricating solid state semiconductive devices comprising:
vapor depositing a layer of polycrystalline semiconductive compound to one side of an ohmic contact;
heating said semiconductive layer in the presence of an elemental anionic component of said semiconductive compound for time sufficient to increase the barrier height of the surface of said layer only, and
applying a blocking contact to said surface of semiconductive material.

2. A method according to claim 1 wherein said anionic component is suspended in an oil bath.

3. A method according to claim 1 wherein said anionic component is a vapor.

4. A method according to claim 1 wherein said polycrystalline semiconductive compound is selected from the group consisting of cadmium sulfide, zinc sulfide, cadmium telluride and zinc telluride.

5. A method according to claim 1 wherein said ohmic contact is selected from the group consisting of aluminum, and chromium.

6. A method according to claim 1 wherein said blocking contact is selected from the group consisting of gold, platinum, palladium, nickel, silver, and copper.

7. A method according to claim 1 wherein the elemental anionic component is sulfur.

8. A method of fabricating a solid state semiconductive device comprising:
vapor depositing a thin film of low work function metal onto a smooth, inert, nonconducting substrate;
depositing a thin film of polycrystalline semiconductive compound onto said metal film;
depositing a thin film of high work function metal onto said compound film to form a three layer composite, and
heating said composite in the presence of a silicone oil containing the elemental anion of said compound for time and temperatures sufficient to increase the barrier height of said semiconductive compound adjacent said high work function metal.

9. A method according to claim 8 wherein said low work function metal is selected from the group consisting of aluminum, and chromium.

10. A method according to claim 8 wherein said high work function metal is selected from the group consisting of gold, platinum, palladium, nickel, silver, and copper.

11. A method according to claim 8 wherein said polycrystalline semiconductive compound is selected from the group consisting of cadmium sulfide, zinc sulfide, cadmium telluride, and zinc telluride.

* * * * *